United States Patent [19]
Seo

[11] Patent Number: 6,083,779
[45] Date of Patent: *Jul. 4, 2000

[54] METHOD FOR FABRICATING A THIN FILM TRANSISTOR OF A LIQUID CRYSTAL DEVICE

[75] Inventor: Seong Moh Seo, Anyang-shi, Rep. of Korea

[73] Assignee: LG Electronics Inc, Seoul, Rep. of Korea

[ * ] Notice: This patent is subject to a terminal disclaimer.

[21] Appl. No.: 09/245,027

[22] Filed: Feb. 5, 1999

Related U.S. Application Data

[62] Division of application No. 08/805,386, Feb. 24, 1997, Pat. No. 5,913,113.

[51] Int. Cl.[7] ........................ H01L 21/336; H01L 21/225
[52] U.S. Cl. ........................ 438/158; 438/535; 438/563
[58] Field of Search ........................ 438/158, 563, 438/535, FOR 155, 487, FOR 324

[56] References Cited

U.S. PATENT DOCUMENTS

| | | |
|---|---|---|
| 4,864,376 | 9/1989 | Aoki et al. . |
| 5,061,648 | 10/1991 | Aoki et al. . |
| 5,328,861 | 7/1994 | Miyakawa . |
| 5,523,257 | 6/1996 | Yamazaki et al. . |
| 5,620,910 | 4/1997 | Teramoto . |
| 5,753,542 | 5/1998 | Yamazaki et al. . |
| 5,821,259 | 10/1998 | Yamazaki et al. . |
| 5,827,760 | 10/1998 | Seo .......................................... 438/161 |
| 5,913,113 | 6/1999 | Seo .......................................... 438/166 |

OTHER PUBLICATIONS

T. Yukawa et al., "An Ohmic Contact Formation Method for Fabricating a–Si TFT's on Large Size Substrate", Japan Display, pp. 506–509, 1989.

*Primary Examiner*—Mary Wilczewski
*Attorney, Agent, or Firm*—Finnegan, Henderson, Farabow, Garrett & Dunner, L.L.P.

[57] ABSTRACT

A method for fabricating a thin film transistor of a liquid crystal display device comprising the steps of introducing a dopant into an indium tin oxide layer or gate insulating layer with an ion shower doping process, forming an amorphous silicon layer thereon, exposing the amorphous silicon layer with a laser beam to diffuse the dopant into the amorphous layer and activate the dopant. As a result of the laser annealing, an n or p-type ohmic polysilicon layer and an intrinsic polysilicon channel layer can be formed. A gate electrode can also be formed on a gate insulating layer using a gate mask.

5 Claims, 8 Drawing Sheets

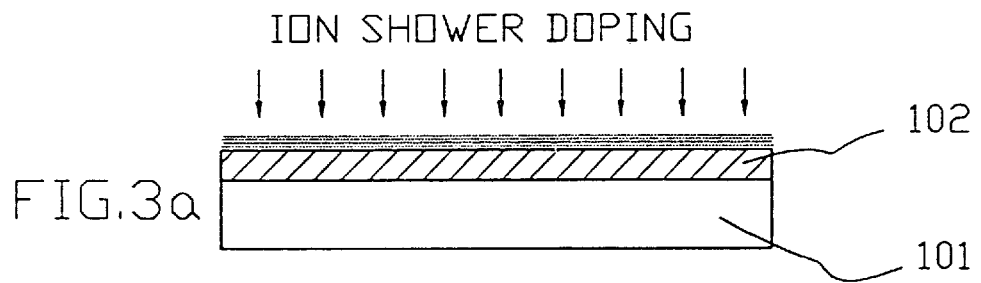
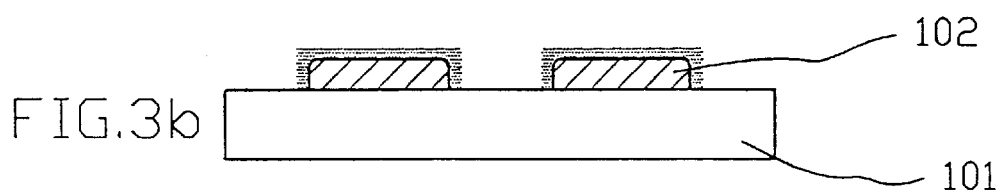
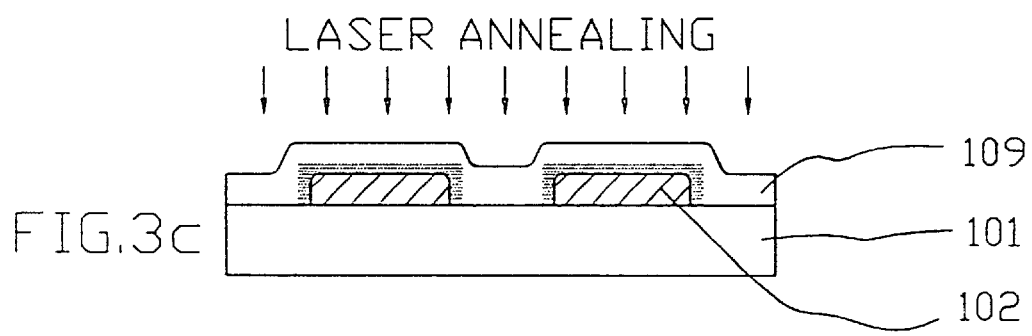
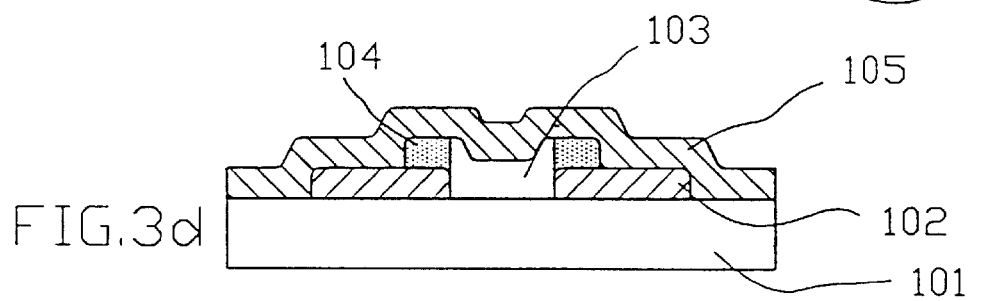
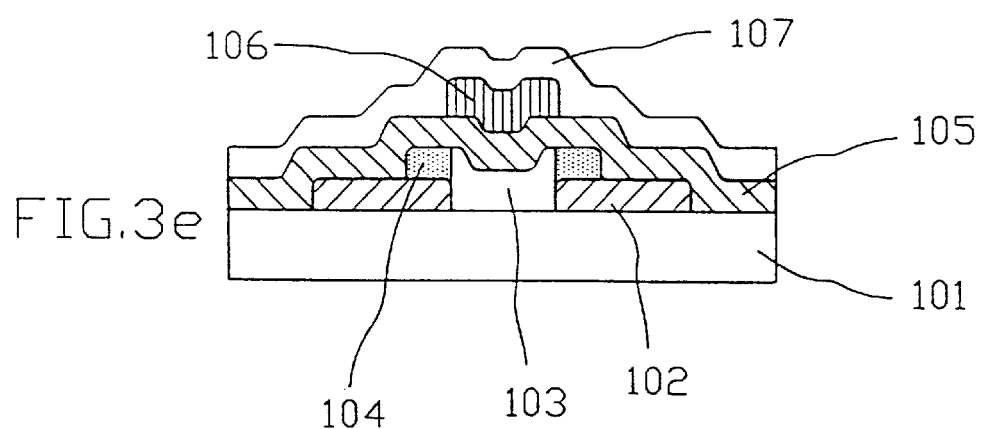

ION SHOWER DOPING

LASER ANNEALING

METHOD FOR FABRICATING A THIN FILM TRANSISTOR OF A LIQUID CRYSTAL DEVICE

This is a division of application Ser. No. 08/805,386, filed Feb. 24, 1997, now U.S. Pat. No. 5,913,113, which is incorporated herein by reference.

BACKGROUND OF THE INVENTION

The present invention relates to a thin film transistor, and more particularly to a method for fabricating a thin film transistor of a liquid crystal display device in which an n or p-type polysilicon ohmic layer and a channeling layer of intrinsic polysilicon can be formed simultaneously by laser annealing of an amorphous silicon layer.

Active matrix liquid crystal displays (AMLCDs) are used for large screen area and high resolution application. In the AMLCD, pixels are driven independently by selectively activating thin film transistors (TFTs) associated with each pixel.

FIG. 1a is a schematic view of a conventional AMLCD structure. FIG. 1b illustrates a plan view representing a pixel. As shown in FIG. 1a, gate bus lines 23 and data bus lines 22 are connected to a gate driver circuit 30 and a data driver circuit 31, respectively. TFTs 21 are formed at the intersections of gate bus lines 23 and data bus lines 22. Gate electrodes of the TFTs 21 are connected to gate bus lines 23, and source electrodes are connected data bus lines 22, and the drains are connected to pixel electrodes 24.

When the voltage is applied to the gate electrode of one of TFTs 21 through an associated gate bus line 23, the TFT is turned on to charge an associated pixel electrode 24 with the input signal voltage from data driver circuit 31 through data bus line 22. As a result, the configuration of the liquid crystal changes to regulate the amount of light passing the pixel electrode 24.

FIGS. 2a–2e illustrate various steps of the conventional process for fabricating a staggered TFT.

First, an indium tin oxide (ITO) layer 2 is sputtered onto substrate 1 and etched to form the source/drain electrode and the data bus line, as shown in FIG. 2a. Phosphorus ions are then introduced into the substrate 1, ITO layer 2 being formed by a plasma enhanced chemical vapor deposition process at 250° C. while supplying Ar gas containing 0.5% of $PH_3$, as shown in FIG. 2b. Most of the phosphorus ions diffused into the ITO layer 2 in the depth less than 6 nm or remain on the surface of ITO layer 2.

As shown in FIG. 2c, an amorphous silicon (a-Si) is deposited on substrate 1 and ITO layer 2, and etched to form active layer 9. Accordingly, phosphorus in ITO layer 2 is diffused into semiconductor layer 9 to create a doped $n^+$ a-Si ohmic contact region. Further, an undoped portion of semiconductor layer 9 between ITO layers 2 will become a channel layer 3 consisting of intrinsic a-Si in the a-Si TFT device.

As shown in FIGS. 2d and 2e, a gate insulating layer 5 consisting of SiNx is next formed over the entire area of the substrate 1. A metal layer is then deposited and etched to form the gate electrode 6. Lastly, a passivation layer 7 is formed over the entire area of substrate 1.

In the TFT fabricated by the above-mentioned method, however, it is difficult to maintain a sufficient amount of impurities on the surface of the ITO layer. Thus, it is difficult to form ohmic layer 4 according to the above-described method. In addition, the electron mobility in a-Si is relatively low. Thus, the switching speed of the above-described TFT is poor.

SUMMARY OF THE INVENTION

An object of the present invention is to provide a method for fabricating a thin film transistor of a liquid crystal display device in which an n or a p-type polysilicon ohmic layer and a channel layer of intrinsic polysilicon are simultaneously formed by laser annealing.

In order to achieve this object, a fabrication method of the thin film transistor according to the present invention, as embodied herein, comprises the steps of; forming a conductive layer on a substrate, introducing impurities into the conductive layer, etching the conductive layer, forming a semiconductor layer on the substrate. exposing the semiconductor layer to a laser beam, etching the semiconductor layer, forming a gate insulating layer over the substrate, and forming a gate electrode on the gate insulating layer.

In accordance with a further aspect of the present invention, a method of fabricating a thin film transistor comprises the steps of forming a gate electrode on a substrate, forming a gate insulating layer over the substrate, introducing impurities into the gate insulating layer, forming a semiconductor layer on the gate insulating layer, exposing the semiconductor layer to a laser beam, etching the semiconductor layer to form an ohmic and a channel layer, and forming a source/drain electrode on the ohmic layer.

BRIEF DESCRIPTION OF THE DRAWINGS

FIGS. 3a–3e illustrate various steps of a TFT fabrication process in accordance with a first embodiment of the present invention;

DETAILED DESCRIPTION OF THE INVENTION

Figure 1A:
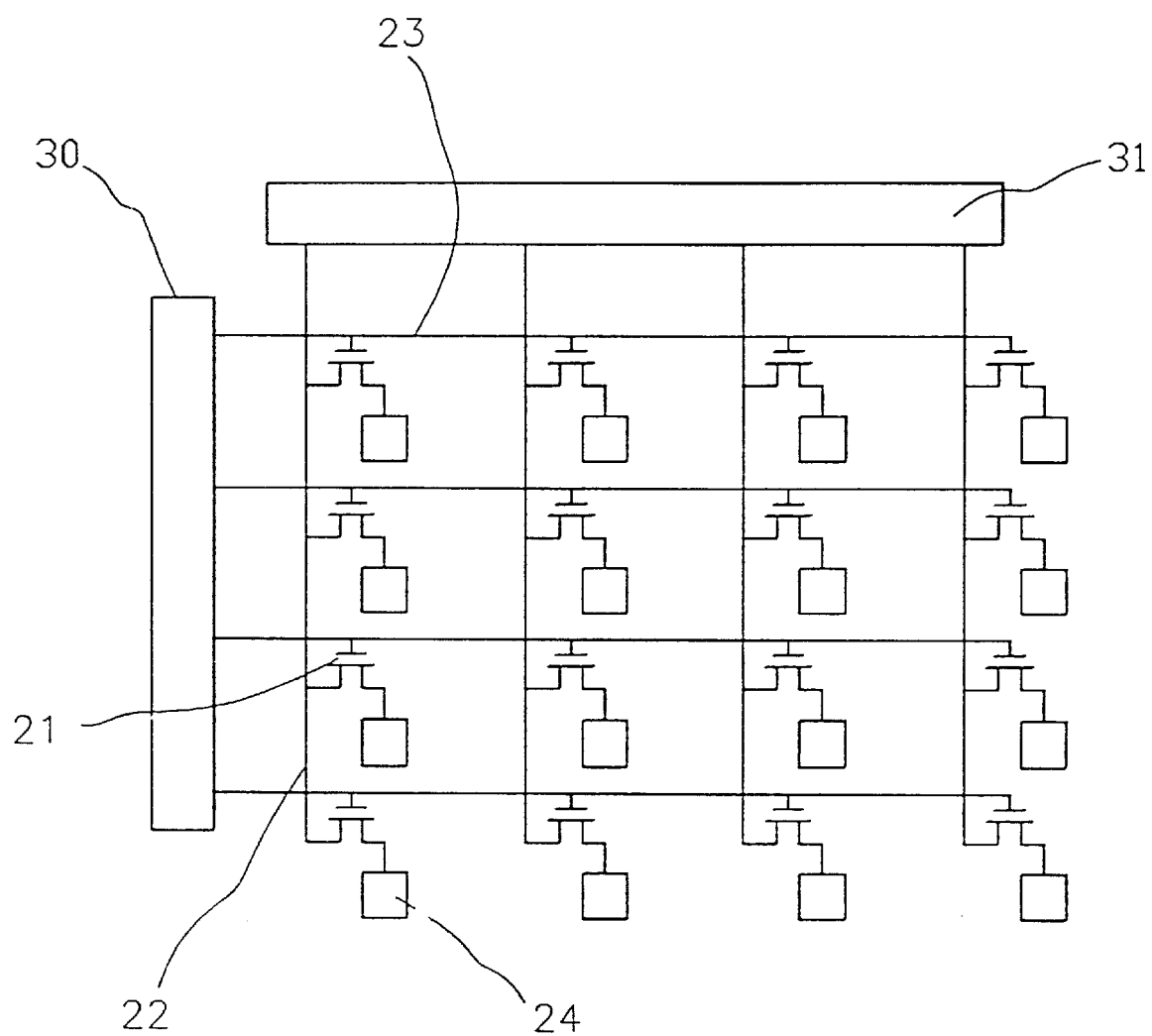
FIGS. 1a–1b illustrate schematic diagram of an active matrix liquid crystal display device and a plan view representing a pixel thereof.
Figure 1B:
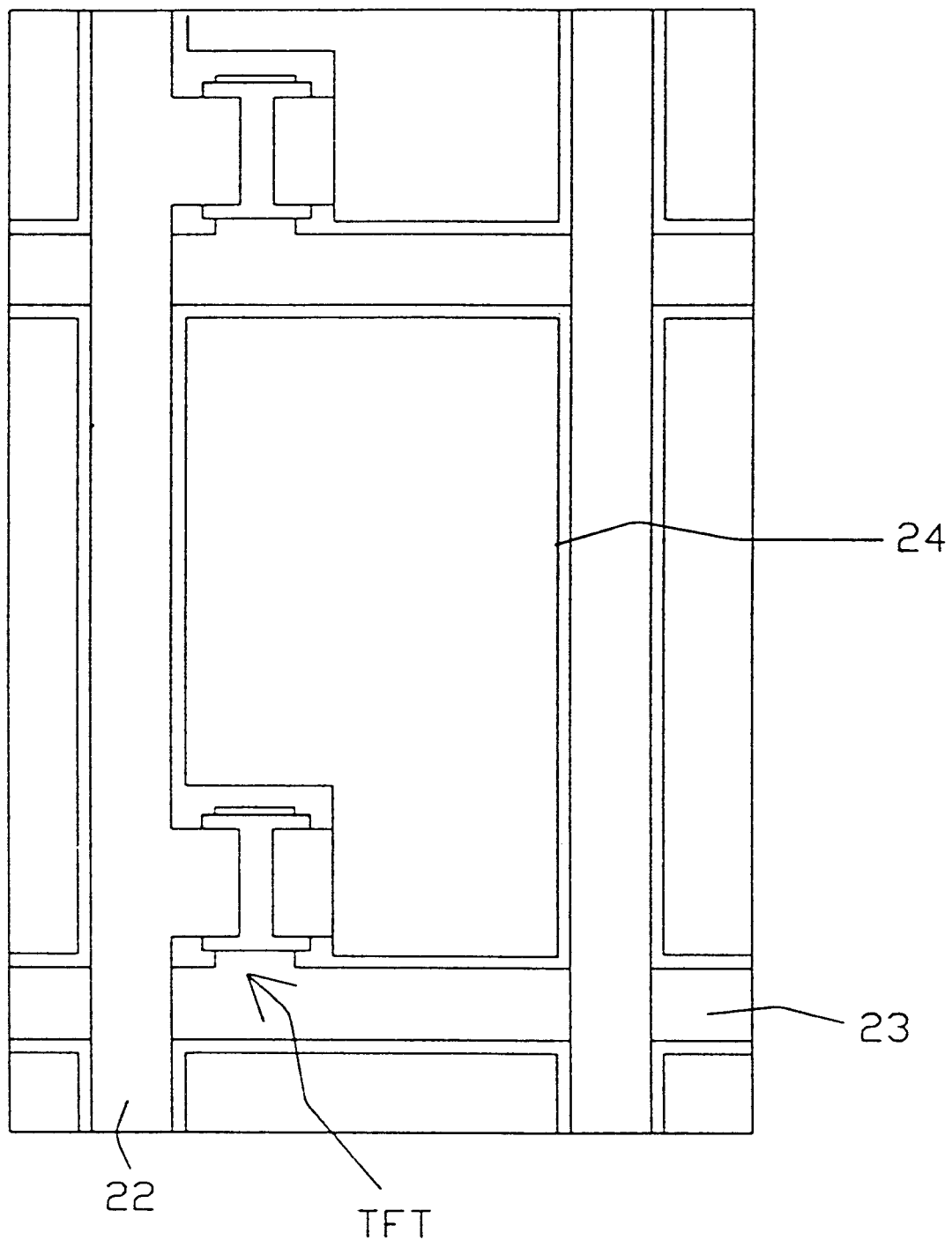
Figure 2A:
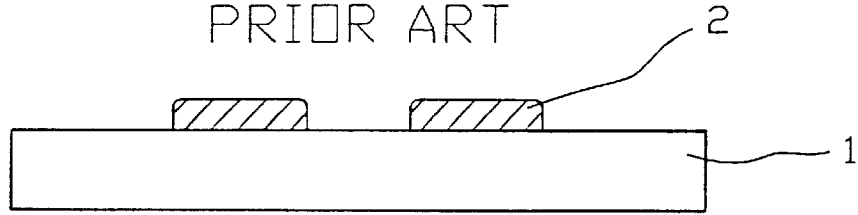
FIGS. 2a–2e illustrate various steps of a conventional TFT process.
Figure 2B:
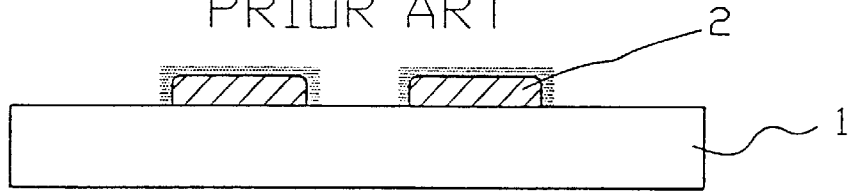
Figure 2C:
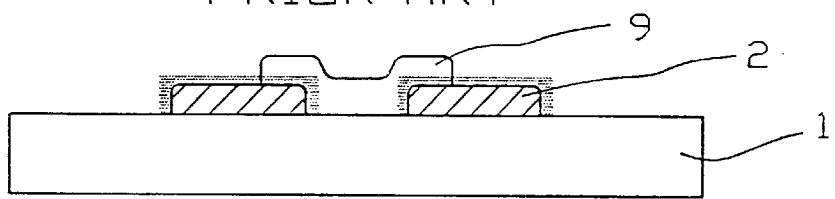
Figure 2D:
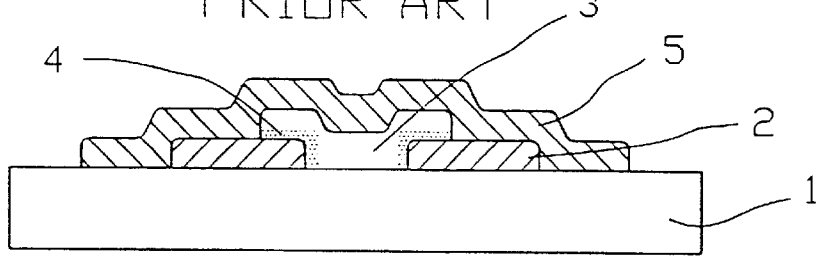
Figure 2E:
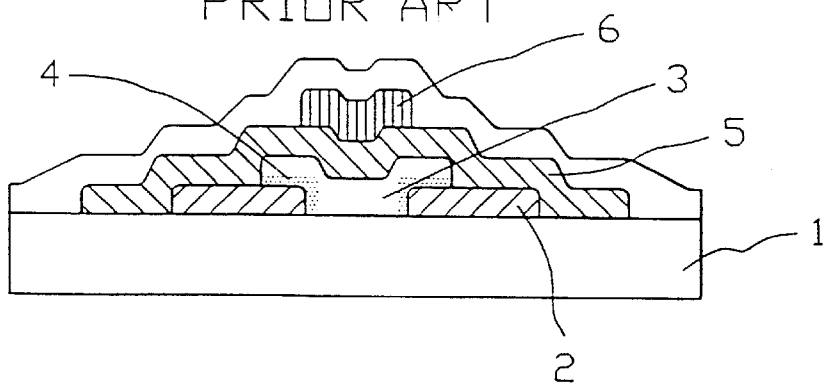

FIGS. 3a–3e illustrate various steps of a staggered TFT fabrication process according to the first embodiment of the present invention.

As shown in FIG. 3a, layer 102 is first formed on substrate 101, and then doped $PH_3$ or $B_2H_6$ with an ion shower doping process. Some of the phosphorus or boron ions diffuse into the ITO layer 102, while the rest remain on the surface of the ITO layer 102. ITO layer 102 is then etched to form the source/drain electrodes and data bus lines.

Next, a semiconductor layer 109, such as a-Si, is formed on substrate 101 and ITO layer 102, as shown in FIGS. 3b and 3c. The a-Si layer 109 is then annealed by a single exposure to a laser beam generated by an eximer. As a result, the phosphorus or boron ions are diffused into layer 109 to create $n^+$ or $p^+$ regions spaced by an intrinsic region. Moreover, the laser annealing converts a-Si layer 109, including the n or p diffused regions and the intrinsic region, into a polycrystalline silicon layer. Further, the diffused ions are activated during the laser annealing step.

As shown in FIGS. 3d and 3e, converted polysilicon semiconductor layer 109 is etched to form portions including channel region 103 and the ohmic regions 104. Ohmic regions 104, which are either n-type or p-type p-Si, are formed on a portion of ITO layer 102. In addition, the channel layer 103, including intrinsic p-Si layer, is formed between the ITO layer 102, i.e., the source electrode and the drain electrode.

Gate insulating layer 105 comprising $SiO_2$ or SiNx is next formed on the ITO layer 102, the channel layer 103, and the ohmic layer 104. Metal is then sputtered, for example, and etched to form the gate electrode 106. Lastly, passivation layer 107 is formed over the entire surface of the substrate.

In the above-described method, the dopant, either phosphorus or boron ions, for example, diffuse from the surface of the ITO layer 102 to a-Si layer 109 during a laser annealing step. The laser annealing further activates these impurities to form ohmic layer 104, and converts the entire layer to polycrystalline silicon (p-Si). Since p-Si has a relatively high mobility, the switching effect of the TFT in accordance with the present invention is improved.

FIGS. 4a–4e illustrate various steps of a process for fabricating an inverted staggered TFT in accordance with a second embodiment of the present invention.

Figure 4A:
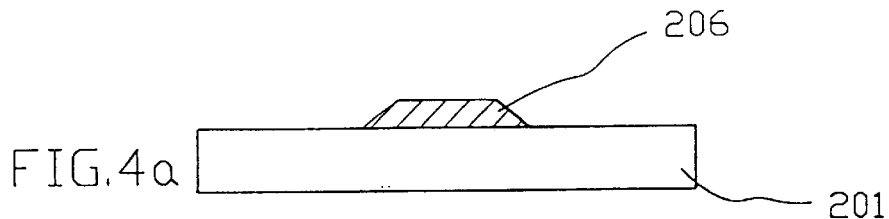
FIGS. 4a–4e illustrate various steps of a TFT fabrication process in accordance with a second embodiment of the present invention.
Figure 4B:
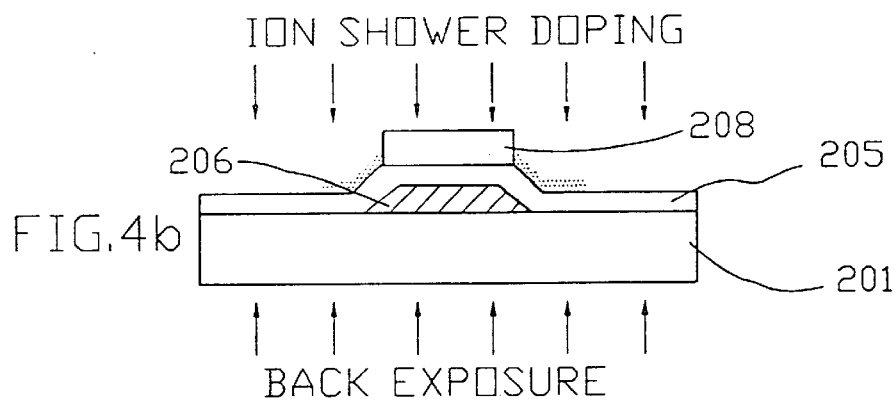

As shown in FIG. 4a, a metal layer, such as Al and Cr, is first sputtered, for example, on substrate 201 and then etched to form the gate electrode 206. Gate insulating layer 205 comprising $SiO_2$ is formed on the substrate 201 and gate electrode 206, followed by coating of photoresist 208, as shown in FIG. 4b. Photoresist 208 is patterned by back exposure using the gate electrode 206 as a mask. Accordingly, the patterned photoresist layer 208 has approximately the same width as gate electrode 206. When the $PH_3$ or $B_2H_6$ molecules are introduced into the gate insulating layer 205 by the ion shower doping process, the gate insulating layer 205 on the gate electrode 206 is shielded from the impinging ions by photoresist 208. Thus, impurities are not introduced into that portion of insulating layer 205. Most phosphorus or boron ions remain on the surface of the gate insulating layer 205 after the ion shower precess, however, and are not diffused into layer 206.

Figure 4C:
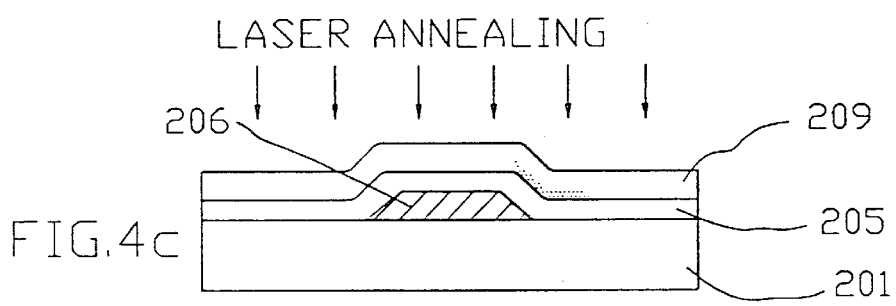

As shown in FIG. 4c, photoresist layer 208 is removed and a Si layer 209 on gate insulating layer 205 is subjected to a laser beam exposure to active and diffuse the impurity ions into the a-Si layer 209. At the same time, the a-Si layer 209 is annealed by the laser beam, so that the portion where the ions are doped becomes n-type or p-type p-Si and the undoped portion of layer 209 becomes the intrinsic p-Si layer.

Figure 4D:
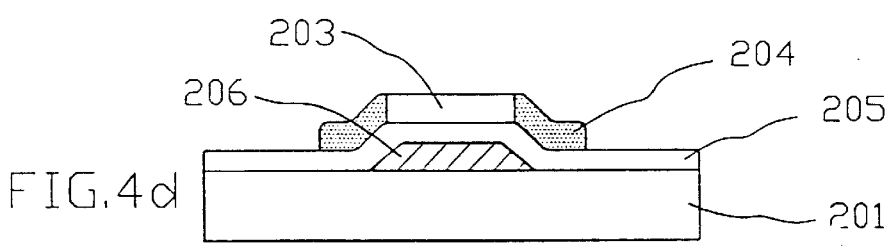
Figure 4E:
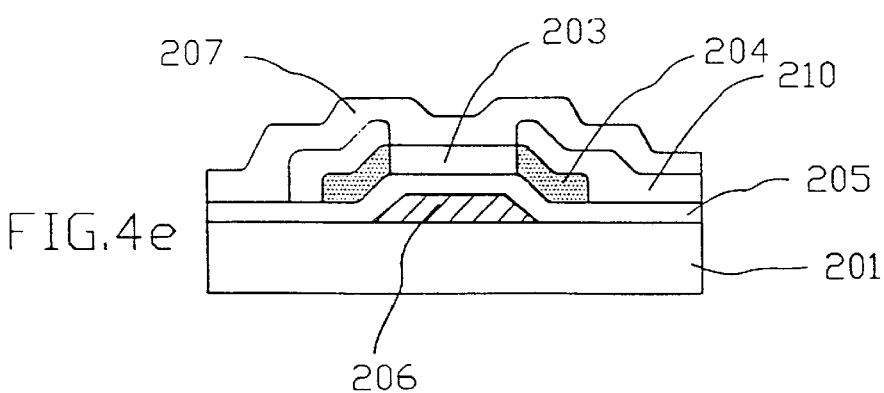

The p-Si layer is then etched to form an active layer including an intrinsic p-Si channel region, having approximately the same width as gate electrode 206. Further, ohmic layer 204 of n-type or p-type p-Si are formed on opposite sides of the channel layer 203, as shown in FIG. 4d. ITO is then deposited on the semiconductor layer 209 and the gate insulating layer 205, and etched to form the source/drain electrode 210 on the ohmic layer 204. Passivation layer 207 is next formed over the entire substrate 201, as shown in FIG. 4e.

In the above described TFT having an inverted staggered structure, doping ions are diffused into the a si layer during the laser annealing step to form ohmic layers. Further, since the ohmic layer and the channel layer comprise p-Si, the switching effect of the TFT is improved.

FIGS. 5a–5f illustrate a method in accordance with a third embodiment of the present invention. In this embodiment, the resulting TFT has an inverted coplanar structure.

Figure 5A:
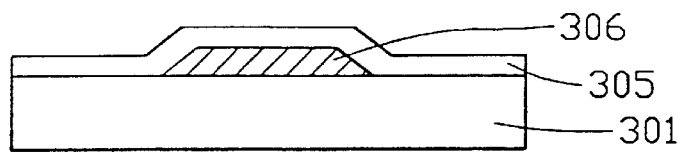
FIGS. 5a–5f illustrate various steps of a TFT fabrication process in accordance with a third embodiment of the present invention.
Figure 5B:
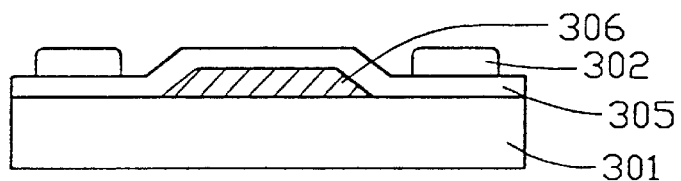
Figure 5C:
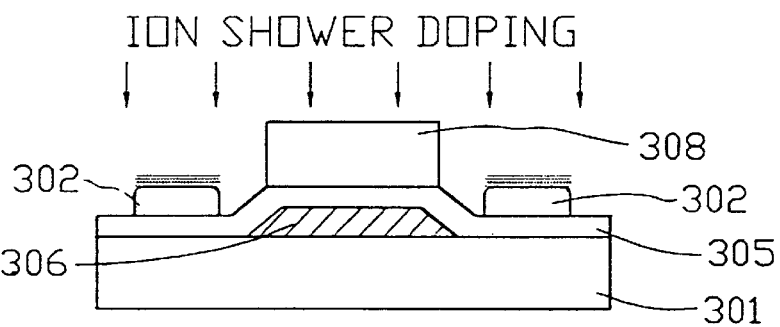

As shown in FIGS. 5a and 5b, a metal, such as Al and Cr, is deposited on substrate 301 and then etched to form gate electrode 306. Gate insulating layer 305, such as $SiO_2$ is formed on gate electrode 306 and substrate 301. Patterned ITO layers 302 are next provided serving as source/drain electrodes and the data bus line. Thereafter, photoresist 308 is coated on the ITO layer 302 and the gate insulating layer 305 and patterned using back exposure of light with the gate electrode 306 as a mask. As a result, photoresist layer 308 is exposed except for a portion shielded by gate electrode 306. Thus, the width of the photoresist over the gate electrode 306 is the same as that of the gate electrode 305. Subsequently, $PH_3$ molecules or $B_2H_6$ molecules are doped into the ITO layer 302.

Figure 5D:
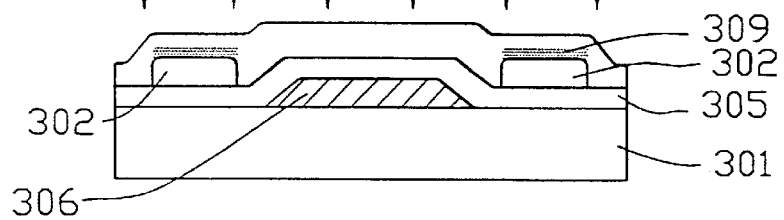
Figure 5E:
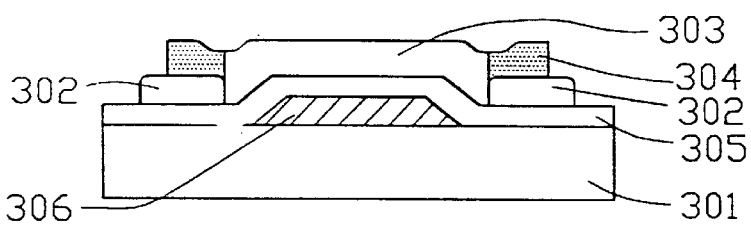
Figure 5F:
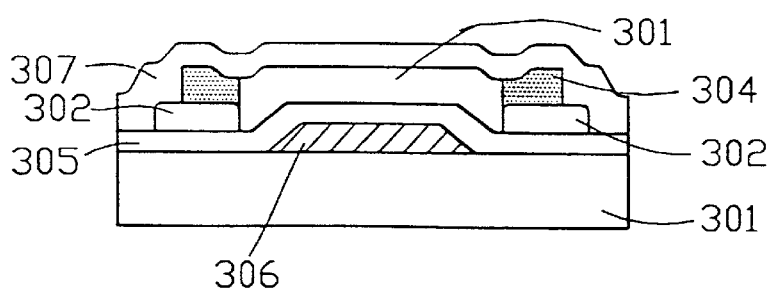

As shown in FIG. 5d, a-Si layer 309 is formed on the gate insulating layer 305 and ITO layer 302 and then subjected to a single laser beam exposure. Accordingly, the dopant, P or B ions, are diffused into the a-Si layer 309, and activated. Further, the a-Si layer 309 is crystallized by laser annealing and converted to polycrystalline material. Thus, by patterning the semiconductor layer 309, as shown FIG. 5e, channel layer 303 of intrinsic p-Si and the ohmic layer 304 of n-type or p-type p-Si are formed. Passivation layer 307 is next formed, as shown in FIG. 5f.

FIGS. 6a–6f illustrate various steps of a method in accordance with a fourth embodiment of the present invention. In this embodiment, the resulting TFT has an coplanar structure.

Figure 6A:
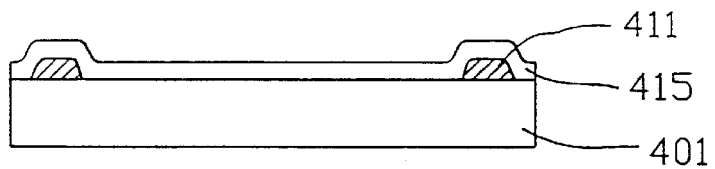
FIGS. 6a–6f illustrate various steps of a TFT fabrication process in accordance with a fourth embodiment of the present invention.

As shown in FIG. 6a, an alignment key 411 is formed on the corner of the substrate 401 and insulating buffer layer 415 is formed over the substrate 401. This alignment key is used for aligning a gate mask and the substrate 401 in subsequent photolithography and gate electrode processes.

Figure 7:
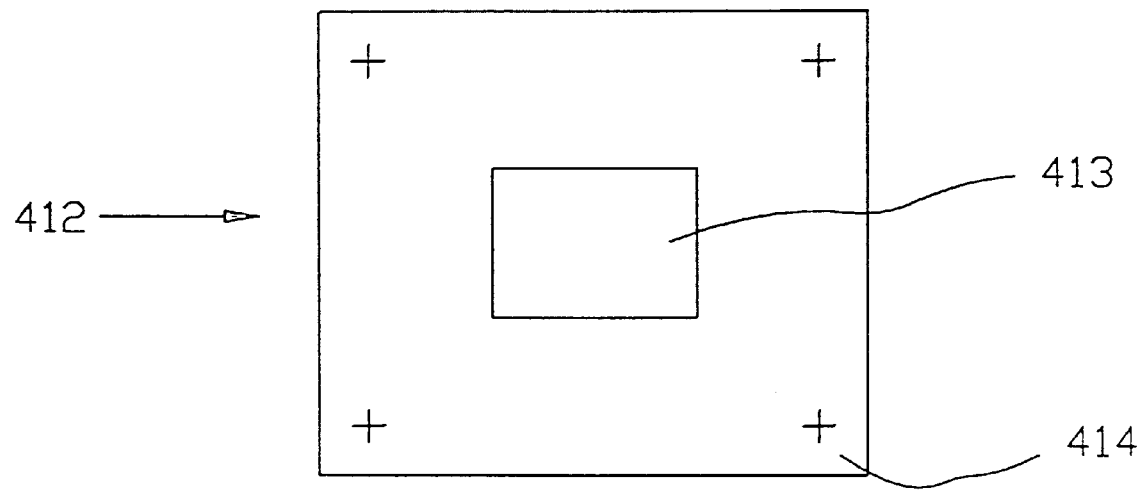
FIG. 7 illustrate a plan view of a gate mask used for fourth embodiment.

FIG. 7 is a plan view of the gate mask 412. The gate electrode mask includes a gate electrode pattern 413 formed in the center of the gate mask 412, and alignment keys 414 are formed in the corners of gate mask 412. Accordingly, when keys 414 and 411 are aligned, substrate 401 and gate mask 412 are aligned with each other to accurately form the gate electrode of the channel layer.

Figure 6B:
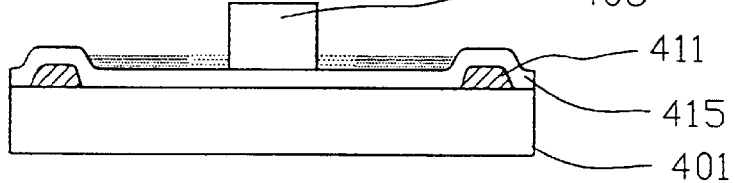
Figure 6C:
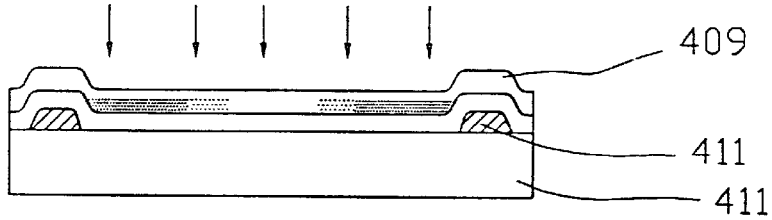
Figure 6D:
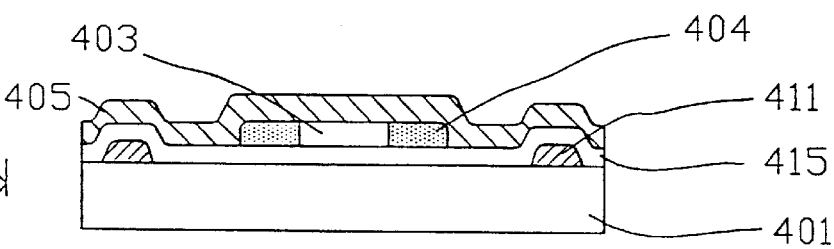

As shown in FIG. 6b. patterned photoresist 408 is coated on the gate insulating layer 415, and then $PH_3$ molecules or $B_2H_6$ molecules are doped into the insulating layer 415 using and ion shower doping process. A-Si layer 409 is next formed on the insulating layer 415 and subjected to a single laser beam. Accordingly, the dopant is activated and diffused into the a-Si layer. Further, the laser annealing converts the a-Si layer 409 into polycrystalline material, as discussed above.

As shown in GIG. 6d, semiconductor layer 409 is patterned to include intrinsic p-Si channel layer 403, which was shielded by photoresist 408 during the ion shower process, and ohmic layers 404 on opposite sides of the channel layer 403. Further, gate insulating layer 405, such as $SiO_2$ or SiNx, is formed on semiconductor layer 409 and the insulating layer 415.

Figure 6E:
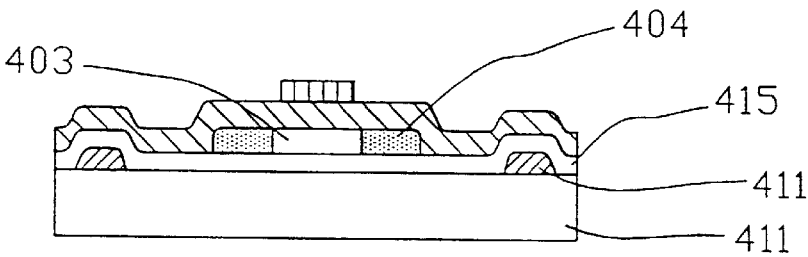
Figure 6F:
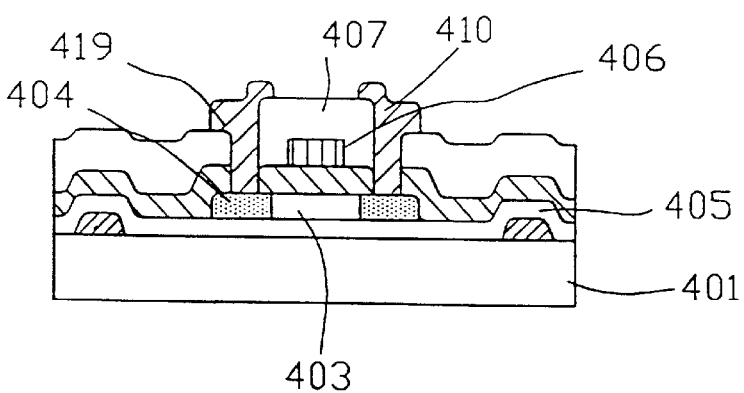

A metal, such as Al and Cr, is then deposited and etched using the gate mask 412 to form the gate electrode 406 on gate insulating layer 405, as shown in FIG. 6e, ITO layer 407 is next formed over the surface of substrate 401, and then patterned to form contact holes 419, as shown in FIG. 6f. Metal, such as Al and Cr, is then deposited into contact hole 419 to form the source/drain electrode 410.

In the present invention, the ohmic and channel region comprise p-Si and are simultaneously formed by subjecting the a-Si layer to a single laser beam exposure. Moreover, dopant impurities within the ohmic layer are activated. Since it is not necessary to include a separate activation step, the TFT is easily fabricated in accordance with the present invention. In addition, since the channel layer includes p-Si, the switching effect of the TFT is improved.

While the preferred form of the present invention has been described, it is to be understood that modifications will be apparent to those skilled in the art without departing from the spirit of the invention.

The scope of the invention, therefore, is to be determined solely by the following claims.

What is claimed is:

1. A method for fabricating a thin film transistor of a liquid crystal display device, comprising the steps of:

forming a gate electrode of a substrate;

forming a gate insulating layer on said substrate;

introducing impurities into said gate insulating layer;

forming a semiconductor layer on said gate insulating layer, said semiconductor layer including an amorphous semiconductor layer;

exposing said semiconductor layer to a laser beam so as to diffuse said impurities into said semiconductor layer and activate said impurities within said semiconductor layer;

etching said semiconductor layer to form an ohmic layer and a channel layer; and forming source/drain electrodes on said ohmic layer.

2. A method for fabricating a thin film transistor according to claim 1, further comprising the steps of:

coating a photoresist layer on said gate insulating layer; and patterning said photoresist layer to shield said gate electrode from the introduced impurities.

3. A method for fabricating a thin film transistor according to claim 2, wherein said patterning step includes a back exposure step using said gate electrode as a mask.

4. A method for fabricating a thin film transistor according to claim 1, further comprising the step of forming a passivation layer on said substrate.

5. A method for fabricating a thin film transistor according to claim 1, wherein said introducing step includes an ion shower process.

* * * * *